US012500559B2

(12) United States Patent
Cosentino

(10) Patent No.: US 12,500,559 B2
(45) Date of Patent: Dec. 16, 2025

(54) DIFFERENTIAL BUFFER CIRCUIT

(71) Applicant: STMicroelectronics S.r.l., Agrate Brianza (IT)

(72) Inventor: Gaetano Cosentino, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 750 days.

(21) Appl. No.: 17/827,293

(22) Filed: May 27, 2022

(65) Prior Publication Data
US 2023/0402980 A1 Dec. 14, 2023

(51) Int. Cl.
*H03F 3/45* (2006.01)
*H03F 3/72* (2006.01)
*H04B 1/16* (2006.01)

(52) U.S. Cl.
CPC ....... *H03F 3/45179* (2013.01); *H03F 3/4508* (2013.01); *H03F 3/72* (2013.01); *H04B 1/16* (2013.01); *H03F 2200/69* (2013.01); *H03F 2203/45* (2013.01)

(58) Field of Classification Search
CPC ...... H03F 3/45179; H03F 3/4508; H03F 3/72; H03F 2200/69; H03F 2203/45; H04B 1/16
USPC ................................. 330/253, 254
See application file for complete search history.

(56) References Cited

U.S. PATENT DOCUMENTS

| 5,652,545 A * | 7/1997 | Miyashita | H03F 3/45183 330/306 |
|---|---|---|---|
| 6,980,055 B2 | 12/2005 | Gharpurey | |
| 7,519,301 B2 | 4/2009 | Keil et al. | |
| 8,884,655 B2 | 11/2014 | Mukherjee et al. | |
| 10,742,227 B1 | 8/2020 | Schifmann et al. | |
| 2011/0109388 A1* | 5/2011 | Touzard | H03F 1/26 330/252 |
| 2011/0227648 A1* | 9/2011 | Mohammadi | H03F 1/0272 330/253 |
| 2018/0167038 A1* | 6/2018 | Lee | H03F 3/45188 |

* cited by examiner

*Primary Examiner* — Andrea Lindgren Baltzell
*Assistant Examiner* — Khiem D Nguyen
(74) *Attorney, Agent, or Firm* — Slater Matsil, LLP

(57) ABSTRACT

In an embodiment, a differential buffer includes: first and second input terminals configured to receive a differential input voltage; first and second output terminals configured to provide a differential output voltage; a differential source follower amplifier having first and second inputs respectively coupled to the first and second input terminals, and first and second outputs respectively coupled to the first and second output terminals; and a differential common source amplifier having first and second inputs respectively coupled to the second and first output terminals via a first pair of capacitors, and first and second outputs respectively coupled to the first and second output terminals.

25 Claims, 12 Drawing Sheets

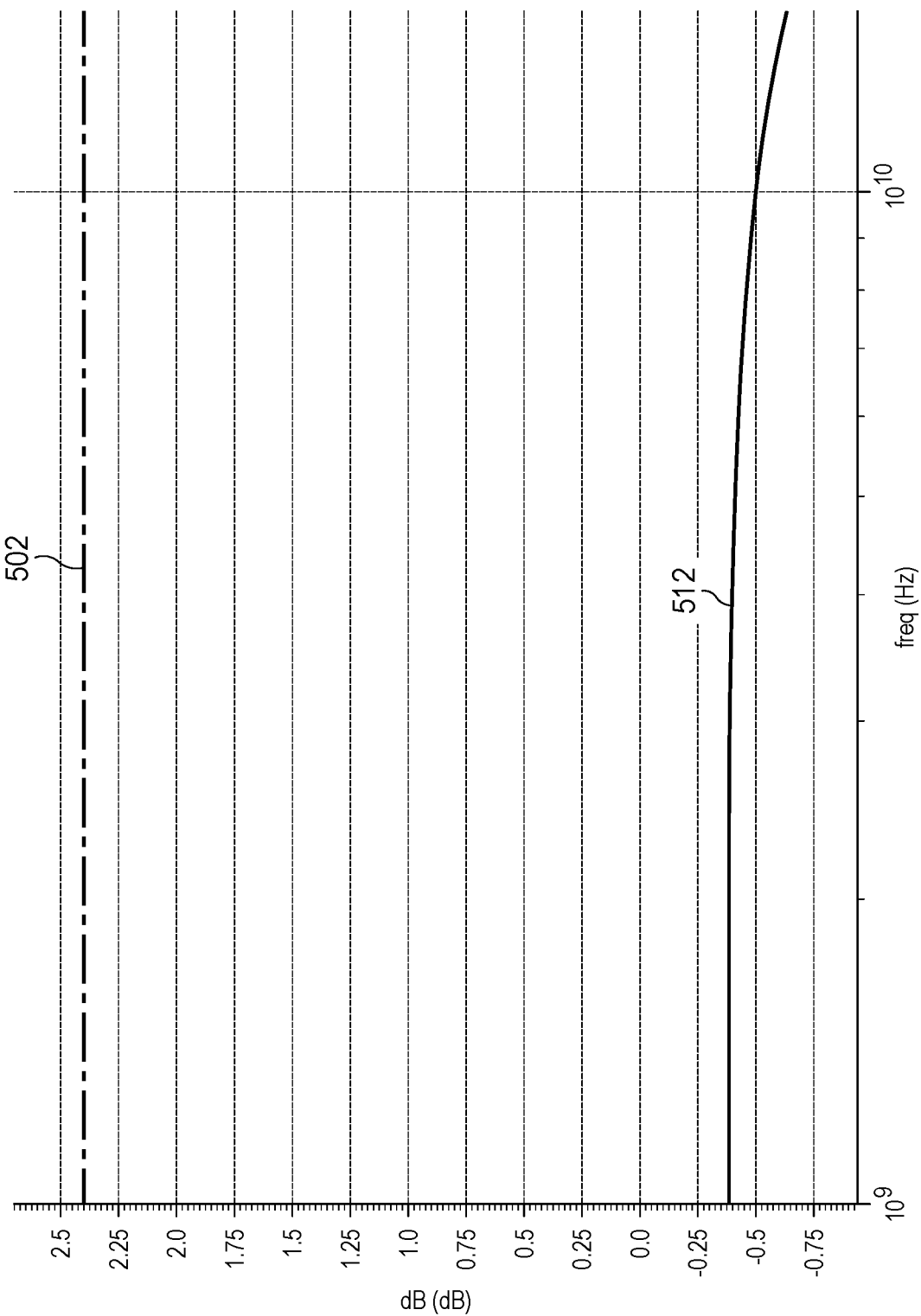

DIFFERENTIAL BUFFER CIRCUIT

TECHNICAL FIELD

The present disclosure relates generally to an electronic system and method, and, in particular embodiments, to a differential buffer circuit.

BACKGROUND

Generally, voltage buffers have a gain of 1 and provide electrical impedance transformation (high input impedance, low output impedance), which advantageously allows a first circuit to drive a second circuit while reducing the loading effect that the second circuit may have on the first circuit. Voltage buffers may be implemented using a source follower amplifier. The use of voltage buffers may be particularly advantageous in radio-frequency (RF) applications, such as applications with operating frequencies above 1 GHz.

RF integrated circuits (ICs) may require several buffers to properly propagate RF signals inside the IC.

FIG. 1 shows a schematic diagram of exemplary complementary metal-oxide-semiconductor (CMOS) differential buffer 100. As shown in FIG. 1, differential source follower amplifier 102 receives differential input Vin ($Vin_p$–$Vin_n$) and provides differential output Vout ($Vout_p$–$Vout_n$). Current mirror circuit 108 provides biasing current $I_{bias}$ to bias differential source follower amplifier 102. Current source 124 provides reference current $I_{ref}$ for current mirror circuit 108.

SUMMARY

In accordance with an embodiment, a differential buffer includes: first and second input terminals configured to receive a differential input voltage; first and second output terminals configured to provide a differential output voltage; a differential source follower amplifier having first and second inputs respectively coupled to the first and second input terminals, and first and second outputs respectively coupled to the first and second output terminals; and a differential common source amplifier having first and second inputs respectively coupled to the second and first output terminals via a first pair of capacitors, and first and second outputs respectively coupled to the first and second output terminals.

In accordance with an embodiment, a method includes: receiving a differential input voltage with inputs of a differential source follower amplifier; receiving, at inputs of a differential common source amplifier, a differential output voltage from outputs of the source follower amplifier, where the outputs of the source follower amplifier are capacitively coupled to the inputs of the common source amplifier, and where outputs of the common source amplifier are coupled to the outputs of the source follower amplifier; and providing the output voltage to an input of a next circuit.

In accordance with an embodiment, a device includes: a first circuit configured to receive a radio-frequency signal and provide a differential input voltage; and a differential buffer including first and second input terminals configured to receive the differential input voltage, first and second output terminals configured to provide a differential output voltage, a differential source follower amplifier having first and second inputs respectively coupled to the first and second input terminals, and first and second outputs respectively coupled to the first and second output terminals, and a differential common source amplifier having first and second inputs respectively coupled to the second and first output terminals via a first pair of capacitors, and first and second outputs respectively coupled to the first and second output terminals.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3, 4, 5A, and 5B illustrate curves associated with the differential driver of FIG. 2, according to embodiments of the present invention;

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
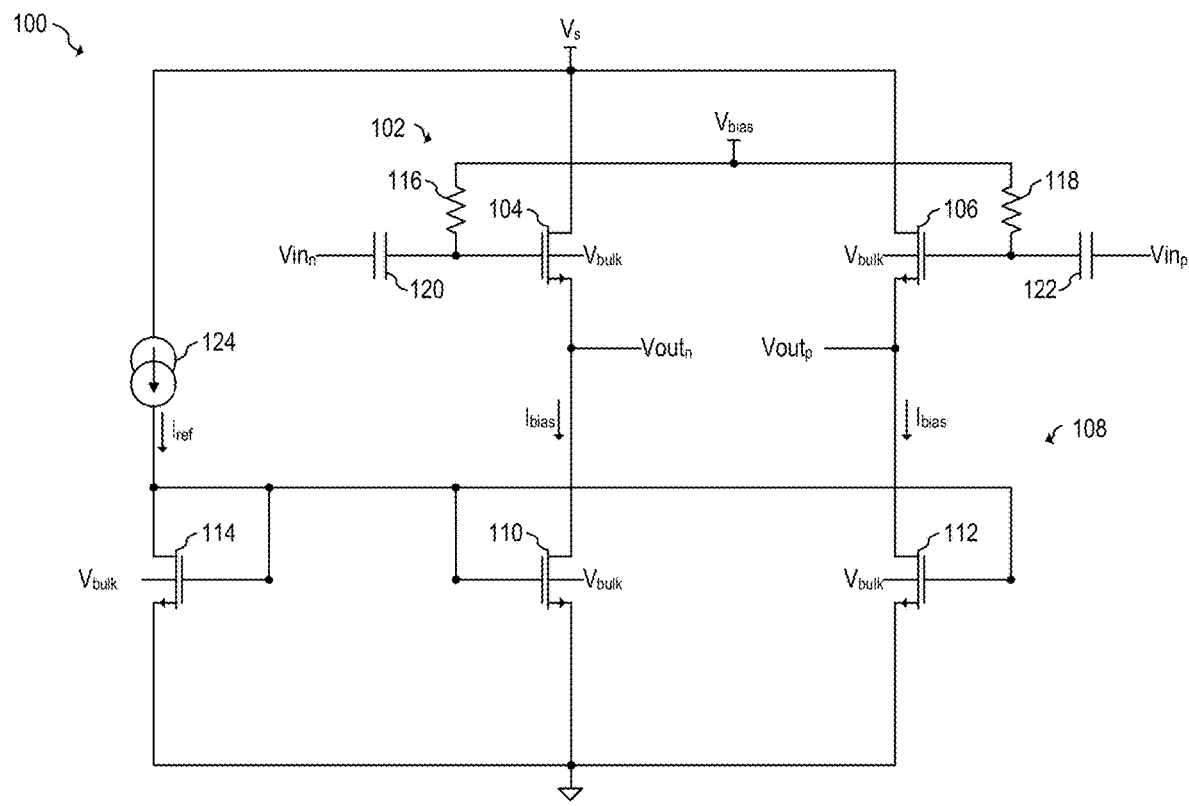
FIG. 1 shows a schematic diagram of an exemplary CMOS differential buffer.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, e.g., a CMOS differential buffer, e.g., for RF applications. Some embodiments may be implemented with transistors different than CMOS transistors, such as using bipolar transistors. Some embodiments may be used at frequencies different from RF frequencies. Some embodiments may be used in radio applications, such as wide band (e.g., >=25 MHz).

Generally, the bias current $I_{bias}$ reference of differential buffer 100 (e.g., which flows in an associated MOS mirror) may be relatively high (e.g., 20 mA, 25 mA) to achieve low output impedance and a good slew rate characteristics for RF frequencies. As a consequence of the body effect, loading of current mirror 108, etc., differential buffer 100 may exhibit an attenuation of, e.g., 2 dB to 3 dB, which may compromise the noise figure (NF), 1 dB compression point, and linearity performance such as second order intercept point (IIP2), third order intercept point (IIP3) and harmonic distortions.

In an embodiment of the present invention, a CMOS differential buffer includes a differential source follower amplifier and a differential degenerated common source amplifier. The outputs of the source follower amplifier and the common source amplifier are connected together, with the outputs of the source follower amplifier being capacitively coupled to the inputs of the common source amplifier. The common source amplifier provides bias current for the current source amplifier and provides an increase in the overall gain of the differential buffer.

Advantages of some embodiments include differentially buffering an RF signal without unwanted attenuation, better 1 dB compression point and better linearity performances (e.g., IIP2, IIP3, and harmonic distortion), and without increasing the current consumption, when compared with using differential buffers such as differential buffer boo.

Figure 2:
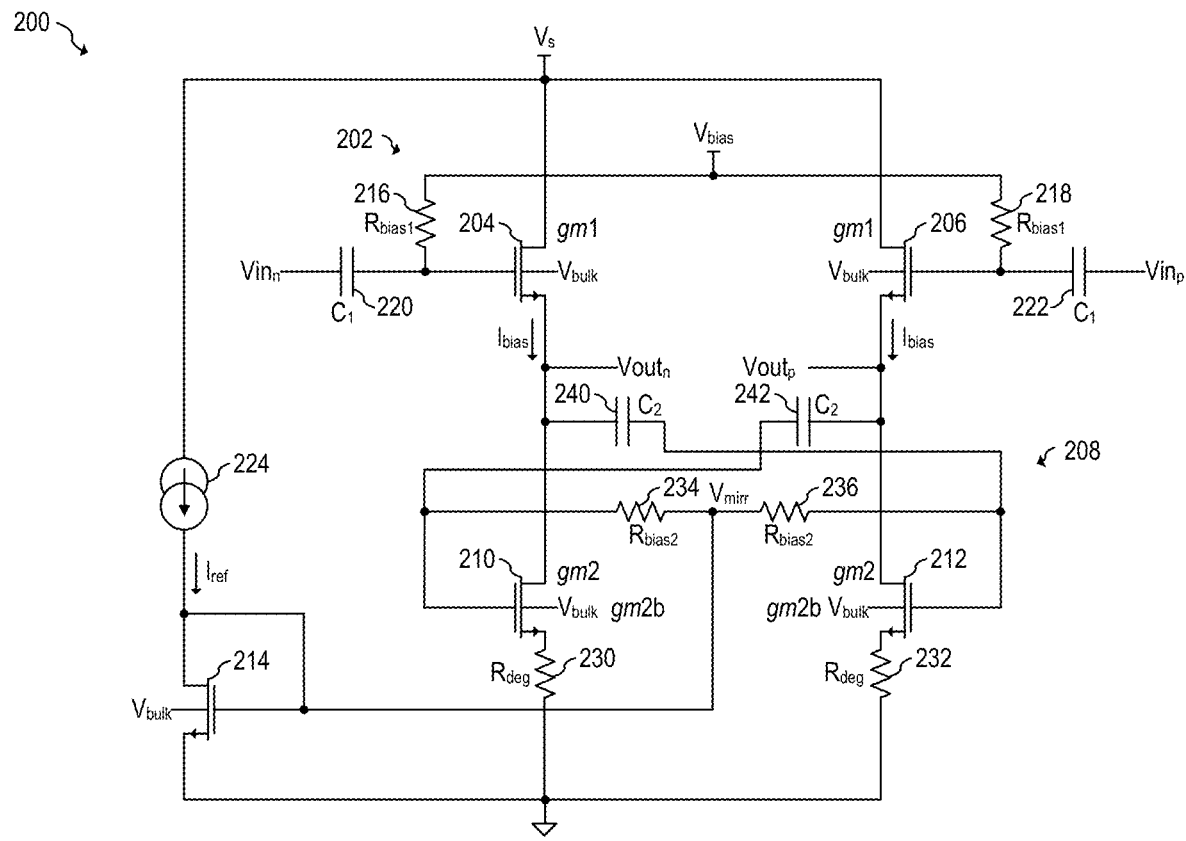
FIG. 2 shows a schematic diagram of a CMOS differential buffer, according to an embodiment of the present invention.

FIG. 2 shows a schematic diagram of CMOS differential buffer 200, according to an embodiment of the present invention. CMOS differential buffer 200 includes differential source follower amplifier 202 and differential common source amplifier 208.

As shown in FIG. 2, the inputs of source follower amplifier 202 are capacitively coupled to receive input voltage Vin via capacitors 220 and 222 and are DC biased by voltage $V_{bias}$. The inputs of common source amplifier 208 are capacitively coupled to the outputs of source follower amplifier 202 via capacitors 240 and 242 and are DC biased by voltage $V_{mirr}$. The outputs of common source amplifier 208 are connected to the outputs of source follower amplifier 202.

During normal operation, common source amplifier 208 provides the bias current $I_{bias}$ for source follower amplifier 202 (e.g., based on voltage $V_{mirr}$). Source follower amplifier 202 receives differential input Vin ($Vin_p$–$Vin_n$). The outputs of source follower amplifier 202 capacitively drive the input of common source amplifier 208. Both amplifiers 202 and 208 provide, in parallel, differential output Vout ($Vout_p$–$Vout_n$). Thus, in some embodiments, source follower 202 performs the function of buffering the input voltage Vin (e.g., in an attenuated manner) and also operates as a load for common source amplifier 208, and common source amplifier 208 performs the function of bias current generator for source follower amplifier 202 and the function of increasing the overall gain of differential buffer 200 (e.g., to unity gain or higher).

In some embodiments, the bias current $I_{bias}$ is dynamically adjusted based on the magnitude of the input voltage Vin. For example, in some embodiments, the bias current $I_{bias}$ advantageously increases when the input voltage Vin is higher (since higher Vin causes higher Vout, which increases the Vgs of transistors 210 and 212), which advantageously results in better linearity.

In some embodiments, the relationship between the W/L ratio of transistors 204 and 206 (which affects the transconductance gm1 of transistors 204 and 206) versus the W/L ratio of transistors 210 and 212 (which affects the transconductance gm2 of transistors 210 and 212) determines the overall gain of differential buffer 200. For example, in some embodiments, source follower amplifier 202 has a gain lower than 1 and common source amplifier 208 has a gain higher than 1 such that the overall gain of differential buffer 200 is 1. Other overall gains, such as higher than 1 (e.g., 1.1, 1.2, or higher) or lower than 1 (e.g., 0.9, 0.8, or lower), may also be possible.

In an embodiment, transistors 204 and 206 have W=120 µm and L=40 µm so that W/L=3, transistors 210 and 212 have W=60 µm and L=40 µm so that W/L=1.5, and resistors 230 and 232 have resistance $R_{deg}$=6.7Ω, resulting in an overall gain $G_b$ of differential buffer 200 of –0.27 dB. In another embodiment, transistors 204 and 206 have W=20 µm and L=40 µm so that W/L=0.5, transistors 210 and 212 have W=60 µm and L=40 µm so that W/L=1.5, and resistors 230 and 232 have resistance $R_{deg}$=6.7Ω, resulting in an overall gain $G_b$ of differential buffer 200 of 0.029 dB. Other values may also be used.

In some embodiments, overall gain $G_b$ of differential buffer 200 may be given by $$G_b = G_{sf} G_{cs} \tag{1}$$

where $G_{sf}$ represents the gain of source follower amplifier 202 and $G_{cs}$ represents the gain of common source amplifier 208.

In some embodiments, gain $G_{sf}$ may be given by $$G_{sf} = k * \frac{gm1}{gm1b + gm1} \tag{2}$$

where gm1 represents the transconductance of transistors 204 and 206, and gm1b represents the body effect parameter of transistors 204 and 206, where transconductance gm1 depends on the square root of W/L sizing of transistors 204 and 206, and K is a coefficient less than 1 that may include source and input impedance buffer losses and other attenuation effects due parasitic capacitor and similar. For example changing the W of transistors 210 and 212 from 40 µm to 140 µm may cause an increase in the gain of buffer 200 of 2.9 dB (from –1.7 dB up to 1.2 dB).

In some embodiments, gain $G_{cs}$ may be given by $$G_{CS} = \frac{\frac{1}{gm1 + gm1b}}{R_{deg} + \frac{1}{gm2 + gm2b}} \tag{3}$$

where resistance $R_{deg}$ represents the resistance of degeneration resistors 230 and 232, gm2 represents the transconductance of transistors 210 and 212, and gm2b represents the body effect parameter of transistors 210 and 212, where transconductance gm2 depends on the W/L sizing of transistors 210 and 212.

In some embodiments, an amplifier (e.g., such as 602 of FIG. 6) driving differential buffer 200 may have very high output impedance to maximize gain. In some such embodiments, any parasitic load at the input of differential buffer 200 may decrease the maximum potential gain of such amplifier and compromise the NF. Thus, in some embodiments, as shown in FIG. 2, the inputs of common source amplifier 208 are driven by the outputs of source follower amplifier 202 and not by the input of source follower amplifier 202. By driving common source amplifier 208 using the outputs of source follower amplifier 202, some embodiments advantageously avoid increasing the capacitance of the input of source follower 202, which may degrade the performance of differential buffer 200.

In some embodiments, common source amplifier 208 may be driven by the input of source follower 202.

As shown in FIG. 2, in some embodiments, common source amplifier 208 includes degeneration resistors 230 and 232. By including generation resistors 230 and 232 as part of common source amplifier 208, some embodiments advantageously achieve better linearity compared to implementations without using degeneration resistors in common source amplifier 208.

In some embodiments, resistance $R_{deg}$ of degeneration resistors 230 and 232 is between 1Ω and 10Ω. Other values may also be used.

Some embodiments may use, instead of or in addition to degeneration resistors 230 and 232, other degeneration elements. For example, in some embodiments, common source amplifier 208 may be implemented with inductive degeneration (e.g., replacing resistors 230 and 232 with respective inductors).

In some embodiments, common source amplifier 208 is implemented without degeneration resistors 230 and 232. By implementing common source amplifier 208 without degeneration resistors 230 and 232, some embodiments achieve a higher gain $G_{cs}$ and a higher overall gain $G_b$ of differential buffer 200, compared to implementations using degeneration resistors in common source amplifier 208.

As shown in FIG. 2, capacitors 240 and 242 capacitively coupled the outputs of source follower amplifier 202 to the inputs of common source amplifier 208. In some embodiments, such capacitive coupling may be realized by resistance or impedance that permits to have a high impedance biasing and lower impedance follower (e.g., 202) to amplifier (e.g., 208) coupling.

As shown in FIG. 2, differential buffer 200 is implemented with transistors 204, 206, 210 and 212 being n-type transistors. In some embodiments, a differential buffer may be implemented with p-type transistors (e.g., by reversing the circuit shown in FIG. 2).

As shown in FIG. 2, differential buffer 200 is implemented with transistors 204, 206, 210 and 212 being metal-oxide semiconductor (MOS) transistors. Some embodiments may be implemented with other types of transistors, such as bipolar transistors (e.g., NPN or PNP).

In some embodiments, capacitors 220, 222 have the same capacitance $C_1$, and capacitors 240, and 242 have the same capacitance $C_2$. In some embodiments, capacitance $C_1$ is equal to capacitance $C_2$. In some embodiments, capacitance $C_1$ is different from capacitance $C_2$.

In some embodiments, resistors 216 and 218 have the same resistance $R_{bias1}$, and resistors 234 and 236 have the same resistance $R_{bias2}$. In some embodiments, resistance $R_{bias1}$ is equal to resistance $R_{bias2}$. In some embodiments, resistance $R_{bias1}$ is different from resistance $R_{bias2}$. In some embodiments, $R_{bias1}$ and $R_{bias2}$ may be between 1 kΩ and 10 kΩ. Other values may be used.

In some embodiments, voltage $V_{bias}$ may be at the same level or slightly lower (e.g., 100 mV or 200 mV lower) than supply voltage $V_s$.

In some embodiments, the impedance $C_1$ is dominant with respect to resistance $R_{bias1}$ to facilitate transfer of input voltage Vin through source follower amplifier 202. For example, in some embodiments, the reactance of $C_1$ may be 20 times lower than the impedance $R_{bias1}$.

In some embodiments, the body of transistors 204, 206, 210, 212, and 214 are driven by the same voltage $B_{ulky}$.

In some embodiments, current source 224 provides (e.g., constant) reference current $I_{ref}$ to transistor 224 to generate voltage $V_{mirr}$. Current source 224 may be implemented in any way known in the art. In some embodiments, voltage $V_{mirr}$ may be generated in other ways. For example, in some embodiments, voltage $V_{mirr}$ may be generated based on a gain setting of a previous stage (e.g., VGA) providing voltage Vin to differential buffer 200.

In some embodiments, bias current $I_{bias}$ is in the lower hundreds of µA (e.g., 50 µA, 500 µA, etc.) or in the mA range, such as between 3 mA and 10 mA. A bias current $I_{bias}$ lower than 50 µA or higher than 10 mA, such as 20 mA or higher, are also possible. In some embodiments, the value of bias current $I_{bias}$ is selected based on the multiply factor of the current mirror (e.g., 210, 212, 214) and the desired precision and noise level.

In some embodiments, differential driver 200 is designed to drive a 100Ω load with output voltage Vout. In some embodiments, differential driver 200 is designed to drive a 50Ω load with output voltage Vout. Differential driver 200 may be designed to drive other load values, such as 75Ω.

In some embodiments, differential driver 200 is advantageously capable of operating at low supply voltages Vs, such as a supply voltage V s of 1.2 V, 1.1 V, 1 V, or lower. Some embodiments may operate with supply voltages higher than 1.2 V, such as 1.8 V, 2 V, or higher.

Advantages of some embodiments include the capability of driving low impedance output loads while removing the attenuation exhibited by the source follower amplifier (e.g., 202) and without increasing the mean current consumption, e.g., when compared to conventional source follower amplifiers such as 100.

In some embodiments, in the presence of a strong (high amplitude) input voltage Vin, the transistors of the common source amplifier (e.g., 208) are biased with higher current, which may advantageously provide better performance and better linearity when compared to conventional source follower amplifiers such as 100.

Figure 3:
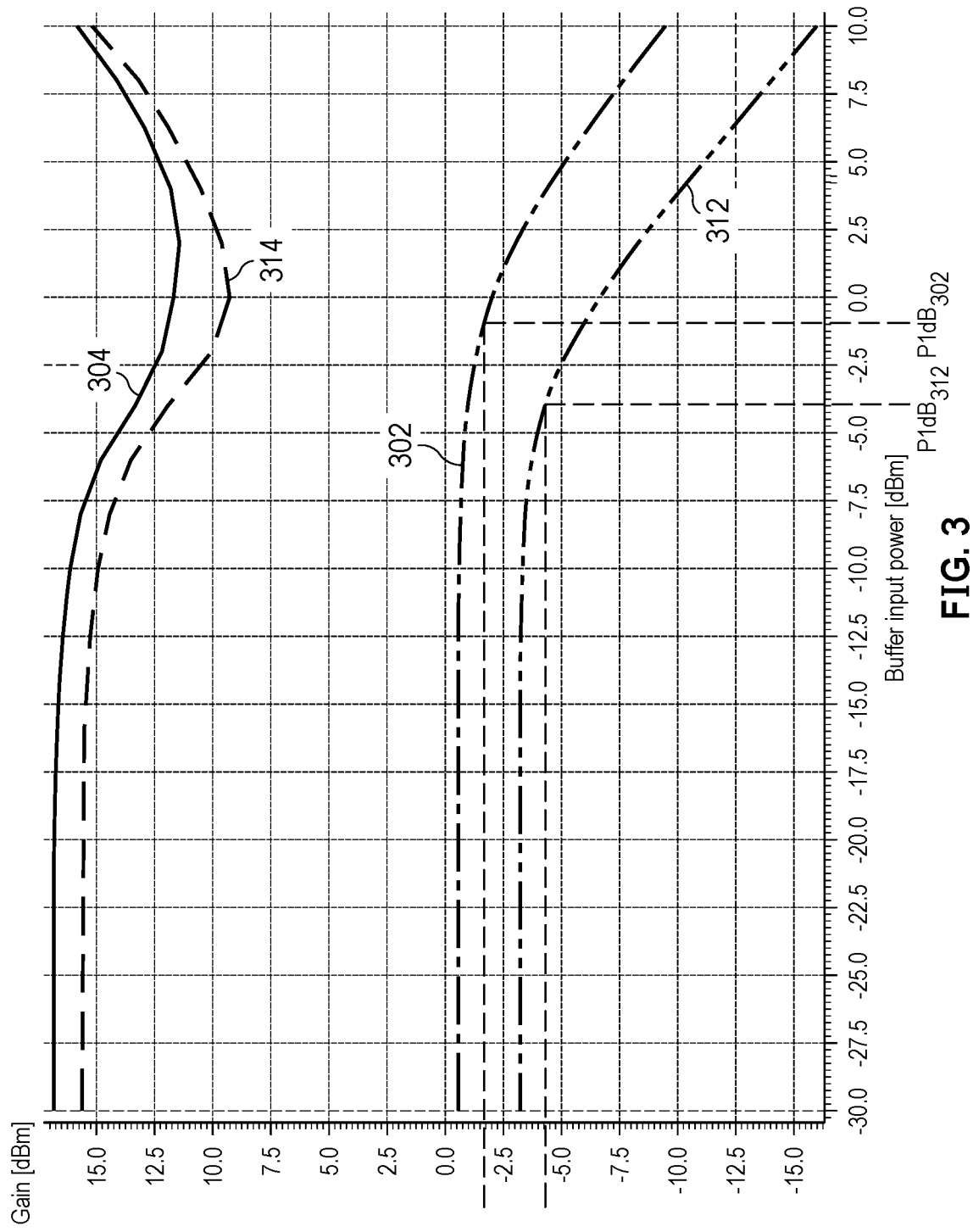

FIG. 3 illustrates attenuation and IIP3 curves associated with differential driver 200, according to an embodiment of the present invention. Curves 302 and 304 represent attenuation and IIP3 curves, respectively, of differential buffer 200 when designed for 100Ω load and with a bias current $I_{bias}$ of 6 mA, according to an embodiment of the present invention. Curves 312 and 314 represent attenuation and IIP3 curves, respectively, of differential buffer 100 when designed for 100Ω load and with a bias current $I_{bias}$ of 6 mA.

As shown in FIG. 3, in some embodiments, differential buffer 200 advantageously exhibits lower attenuation and higher 1 dB compression point than conventional implementations. For example, as shown by curve 302, in some embodiments, differential buffer 200 advantageously exhibits an attenuation of −0.6 dB and a 1 dB compression point $P1dB_{302}$ at −1.6 dBm which is better than differential buffer 100, which exhibits an attenuation of −3 dB and a 1 dB compression point $P1dB_{312}$ at −4 dBm, as illustrated by curve 312. The 1 dB compression point P1dB$_{302}$ advantageously occurs at a higher Vin input power that P1dB$_{312}$.

In some embodiments, differential buffer 200 advantageously exhibits better linearity than differential buffer 100, as shown by higher values of IIP3, as illustrated by curves 304 and 314.

Figure 4:
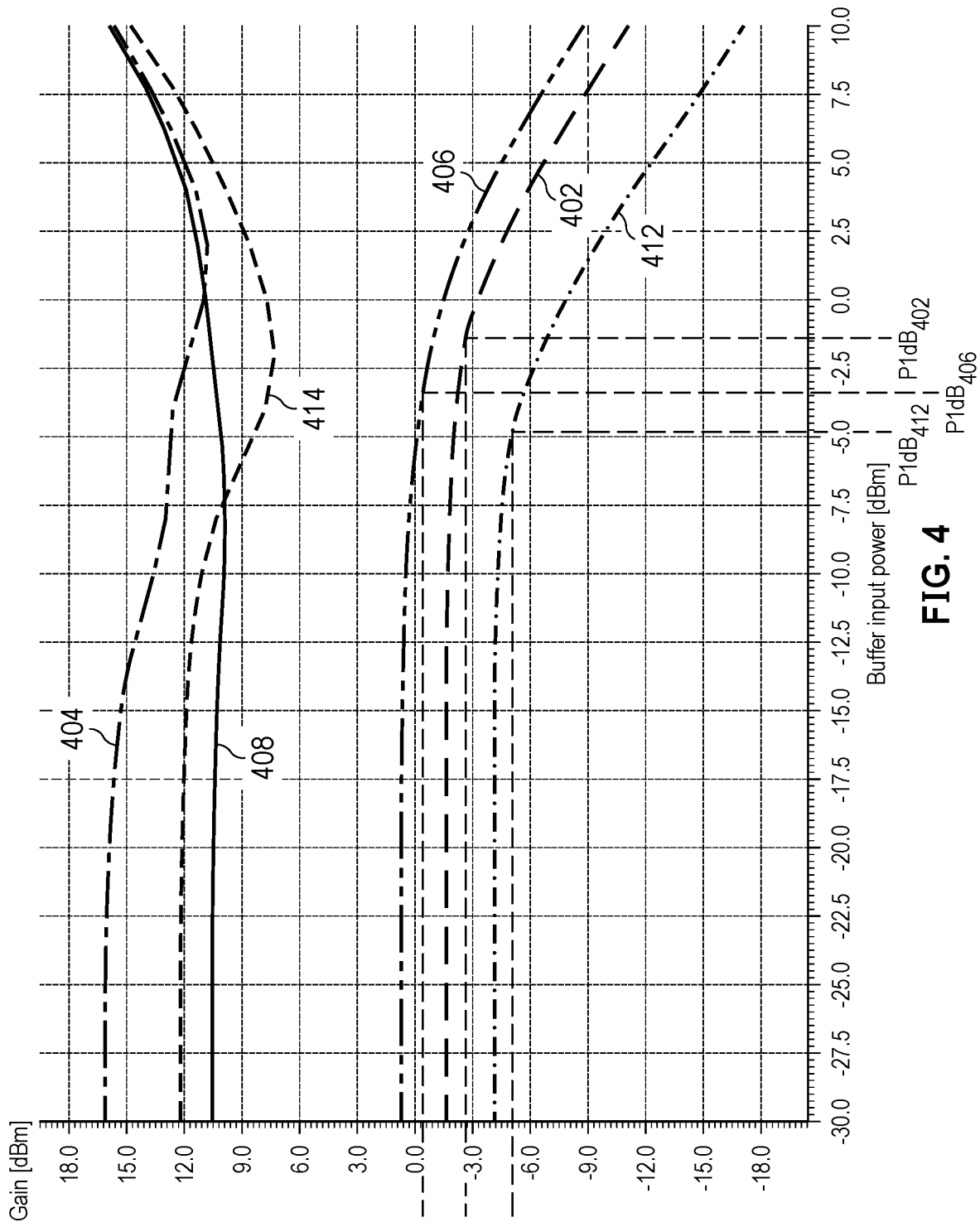

FIG. 4 illustrates attenuation and IIP3 curves associated with differential driver 200, according to an embodiment of the present invention. Curves 402 and 404 represent attenuation and IIP3 curves, respectively, of differential buffer 200 when designed for 50Ω load, and with a bias current I$_{bias}$ of 6 mA, according to an embodiment of the present invention. Curves 406 and 408 represent attenuation and IIP3 curves, respectively, of differential buffer 200 when designed for 50Ω load, with a bias current I$_{bias}$ of 6 mA, and without degeneration resistors 230 and 232, according to an embodiment of the present invention. Curves 412 and 414 represent attenuation and IIP3 curves, respectively, of differential buffer 100 when designed for 50Ω load and with a bias current I$_{bias}$ of 6 mA.

As shown by curves 402, 404, 412, and 414, and similarly to FIG. 3, differential buffer 200 advantageously exhibits lower attenuation and higher 1 dB compression point than conventional implementations. As shown by curve 406, in some embodiments, differential buffer 200 exhibits a higher gain (e.g., higher than 1) without degeneration resistors when compared to using degeneration resistors. As shown by curves 404 and 408, in some embodiments, achieving higher gain by removing degeneration resistors may cause the linearity of the differential buffer to degrade (which may be acceptable in some applications, such as in some power detectors, for example).

As illustrated by curves 402, 404, 406 and 408, in some embodiments, differential buffer 200 is advantageously capable of driving a low impedance load (e.g., 50Ω) with good or relatively good linearity, which may be difficult to achieve with conventional differential buffers, such as 100 (which may require higher currents to drive low impedance loads).

Figure 5B:
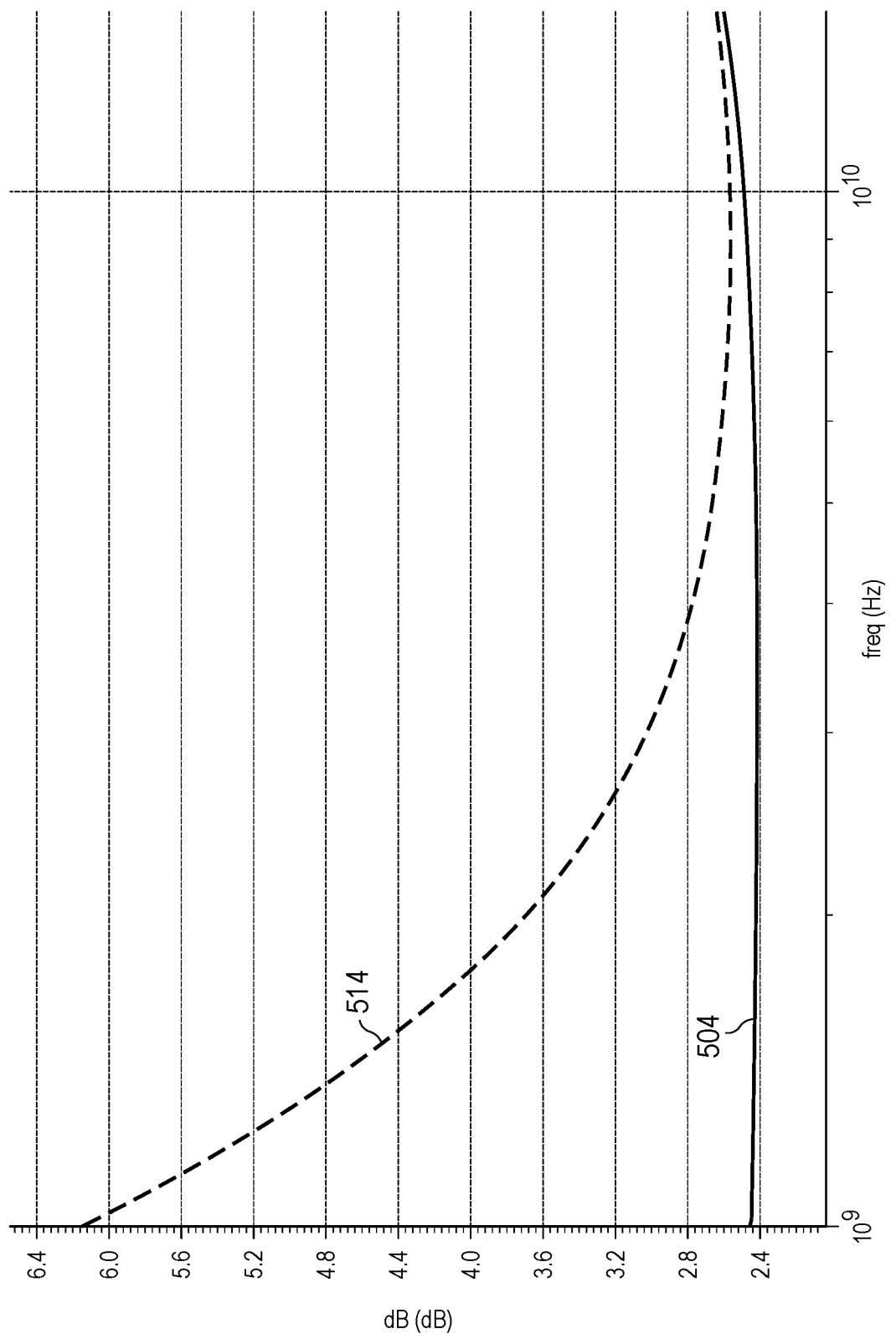

FIGS. 5A and 5B illustrate S21 and NF curves, respectively, associated with differential driver 200, according to an embodiment of the present invention. Curves 502 and 504 represent S21 and NF curves, respectively, of differential buffer 200 when designed for 100Ω load and with a bias current I$_{bias}$ of 6 mA, according to an embodiment of the present invention, where S21 represents the S parameter indicating the amount of power leaving the output of differential buffer 200 (to Vout) given the power received by differential buffer 200 (from Vin). Curves 512 and 514 represent S21 and NF curves, respectively, of differential buffer 100 when designed for 100Ω load and with a bias current I$_{bias}$ of 6 mA.

As shown by curve 502, in some embodiments, differential buffer 200 exhibits higher bandwidth than conventional differential buffers, such as 100 (e.g., as shown by curve 512). As shown by curve 504, in some embodiments, differential buffer 200 exhibits lower NF than conventional differential buffers, such as 100 (e.g., as shown by curve 514).

As can be seen in curve 504, in some embodiments, the attenuation of differential buffer 200 advantageously does not substantially contribute to an increase in NF, as seen from curve 514. In some embodiments, the NF of differential buffer 200 may be reduced further by removing the degeneration resistors 230 and 232.

Advantages of some embodiments include the ability to drive low value impedance loads (e.g., 100Ω, 50Ω, or lower) with high frequency response, high linearity, low attenuation (or with a small gain), and better NF compared to conventional differential buffers. In some embodiments, differential buffer 200 may be advantageously used to replace source follower amplifiers in RF ICs to improve performance without power consumption penalties and with negligible silicon area increase.

Figure 6:
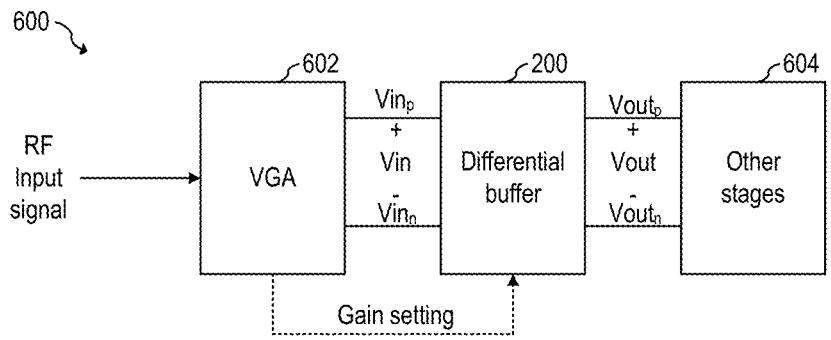
FIG. 6 shows a schematic diagram of a portion of an RF signal chain of a device implementing the differential buffer of FIG. 2, according to an embodiment of the present invention.

FIG. 6 shows a schematic diagram of a portion of an RF signal chain of device 600, according to an embodiment of the present invention. Device 600 includes variable gain amplifier (VGA) 602, differential buffer 200, and other RF stages 604.

As shown in FIG. 6, VGA 602, which may be, e.g., a low-noise amplifier (LNA) drives differential buffer 200 based on an input RF signal (e.g., received from an antenna, e.g., via other circuits, not shown). Differential buffer 200 provides output Vout to other stages 604.

In some embodiments, VGA 602 may be associated to an automatic gain control circuit (analog and/or digital). In some embodiments, the gain settings of VGA 602 is based on a content of a register (e.g., which may be programmed by an external user, such as an external controller).

In some embodiments, the gain of VGA 602 may be set so as to amplify the RF input signal without reaching saturation or distortion. For example, in some embodiments, the gain of VGA 602 may be high when the RF input signal has a low amplitude, and may be low when the RF input signal has a high amplitude.

In some embodiments, the gain setting of VGA 602 may be used to set voltage V$_{mirr}$ of differential buffer 200 (instead of using elements 224 and 214). For example, in some embodiments, when input voltage Vin is weak (low amplitude), the gain setting of VGA 602 may be set to the maximum gain, the NF may be low, and bias current I$_{bias}$ may be reduced (e.g., by using a low voltage V$_{mirr}$). When input voltage Vin is strong (high amplitude), the gain setting of VGA 602 may be lower than the maximum gain, and bias current I$_{bias}$ may be increased (e.g., by using a high voltage V$_{mirr}$). Thus, in some embodiments, voltage V$_{mirr}$ may be based on the gain setting of VGA 602.

In some embodiments, VGA 602 may include more than 10 variable gain settings, such as 30 gain steps or more. In some embodiments, VGA 602 may include less than 10 gain steps, such as 8 gain steps or less.

In some embodiments, VGA 602 may be a low-noise amplifier (LNA). In some embodiments, a non-variable gain amplifier (e.g., an LNA without variable gain) may be used instead of VGA 602.

In some embodiments, other stages 604 include filters, mixers, buffers, and/or amplifiers.

In some embodiments, circuits 200, 602, and 604 may be implemented inside the same IC.

In some embodiments, device 600 is a satellite radio receiver.

In some embodiments, differential buffer 200 may be implemented with a bulk CMOS process. In some embodiments, differential buffer 200 may be implemented with a fully depleted silicon-on-insulator (FD-SOI) CMOS process. In some embodiments implemented using FD-SOI CMOS, the body voltage of transistors 210 and 212 may be adjusted, e.g., based on the voltage Vout, to adjust the threshold voltage Vth of transistors 210 and 212 to achieve improved linearity and reduced power consumption (where the threshold voltage Vth of a transistor may be understood as the minimum gate-to-source voltage to create a conducting path between the source and drain terminals of such transistor).

Figure 7:
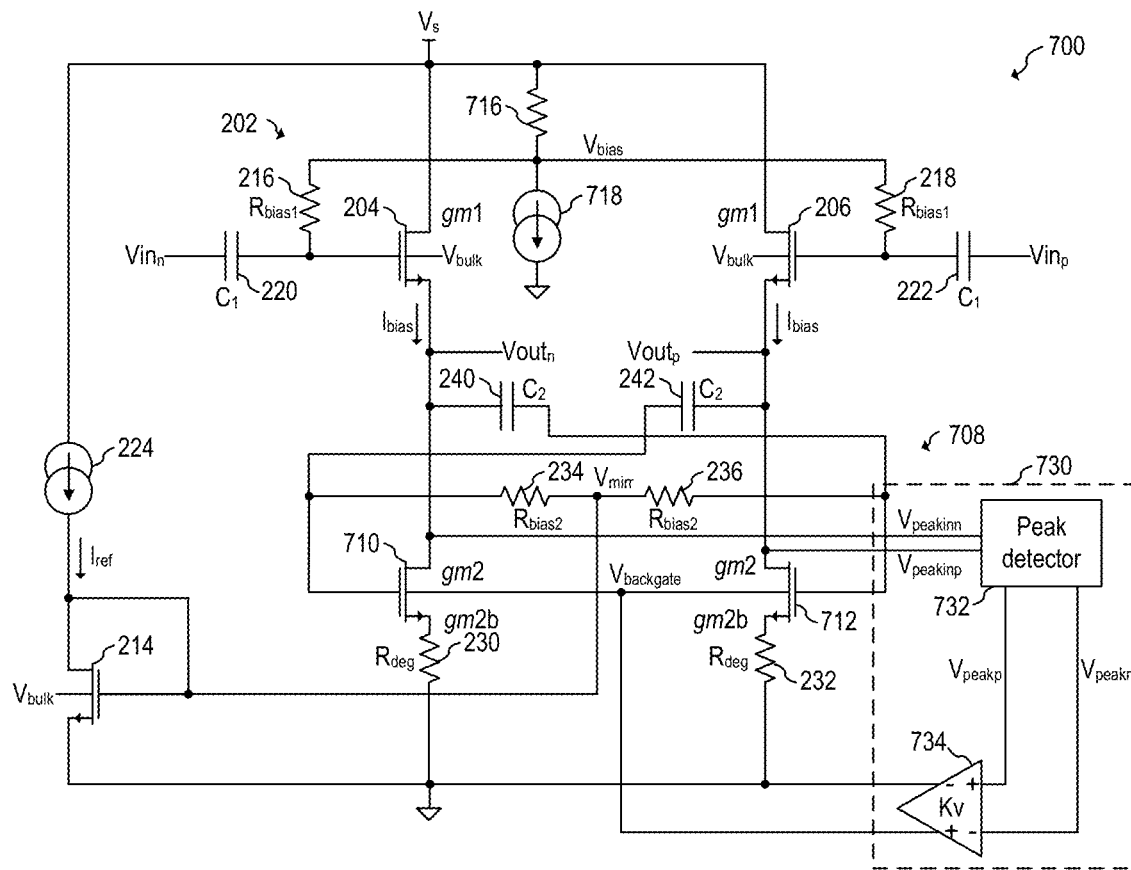
FIG. 7 shows a schematic diagram of a CMOS differential buffer, according to an embodiment of the present invention.

FIG. 7 shows a schematic diagram of CMOS differential buffer 700, according to an embodiment of the present invention. Differential buffer 700 may be implemented with FD-SOI CMOS process, such as 22, 28, or 40 nm FD-SOI CMOS or. Differential buffer 700 may be implemented using other manufacturing process.

Differential buffer 700 may be implemented in a similar manner as differential buffer 200, and may operate in a similar manner as differential buffer 200 (e.g., device 600 may implement differential buffer 700 instead of differential buffer 200). Differential buffer 700, however, includes back-gate control circuit 730 for driving the body of transistors 710 and 712 of common source amplifier 708. As shown in FIG. 7, in some embodiments, back-gate control circuit 730 includes peak detector 732 and differential amplifier 734, where differential amplifier 734 has a gain Ki. In some embodiments, the gain Kv is dynamically adjusted, e.g., based on the gain setting of VGA 602. In some embodiments, gain Ki is between 10 and 40. Other values may be used.

During normal operation, peak detector 732 detects the peak voltage of Vout. Such peak voltage is provided to amplifier 734. Amplifier 734 amplifies the voltage received from peak detector 732 to generate voltage $V_{backgate}$, which is provided to the body of transistors 710 and 712. Thus, in some embodiments, a higher voltage $V_{backgate}$ is applied when Vout has a high peak amplitude (which occurs when Vin has a high peak amplitude) than when Vout has a low peak amplitude (which occurs when Vin has a low peak amplitude).

By dynamically adjusting the body voltage of transistors 710 and 712, some embodiments advantageously dynamically adjust transconductance gm2 and gm2b to improve the linearity characteristic of differential buffer 700. In some embodiments, dynamically adjusting the body voltage of transistors 710 and 712 results in improved linearity performance with an optimized (e.g., lower) current consumption.

In some embodiments, supply voltage V, is 1.2 V and voltage $V_{backgate}$ is modulated between 0 V and 3 V (e.g., depending on the magnitude of voltage Vout or Vin). In some embodiments, supply voltage $V_s$ is 1.2 V and voltage $V_{backgate}$ is modulated between 0 V and 1.8 V (e.g., depending on the magnitude of voltage Vout or Vin). In some embodiments, supply voltage $V_s$ is 1.2 V and voltage $V_{backgate}$ is modulated between 0 V and 1.1 V (e.g., depending on the magnitude of voltage Vout or Vin). Other values may also be used.

In some embodiments, differential buffer 700 may advantageously use lower bias current $I_{bias}$ (e.g., when Vin is weak) compared to other differential buffer implementations such as differential buffers 200 or 100, which achieving good linearity performance. For example, in some embodiments, bias current $I_{bias}$ could be as low as 2 mA (or lower) for a −40 dBm input power from Vin, up to more than 20 mA for −10 dBm input power from Vin.

Figure 8:
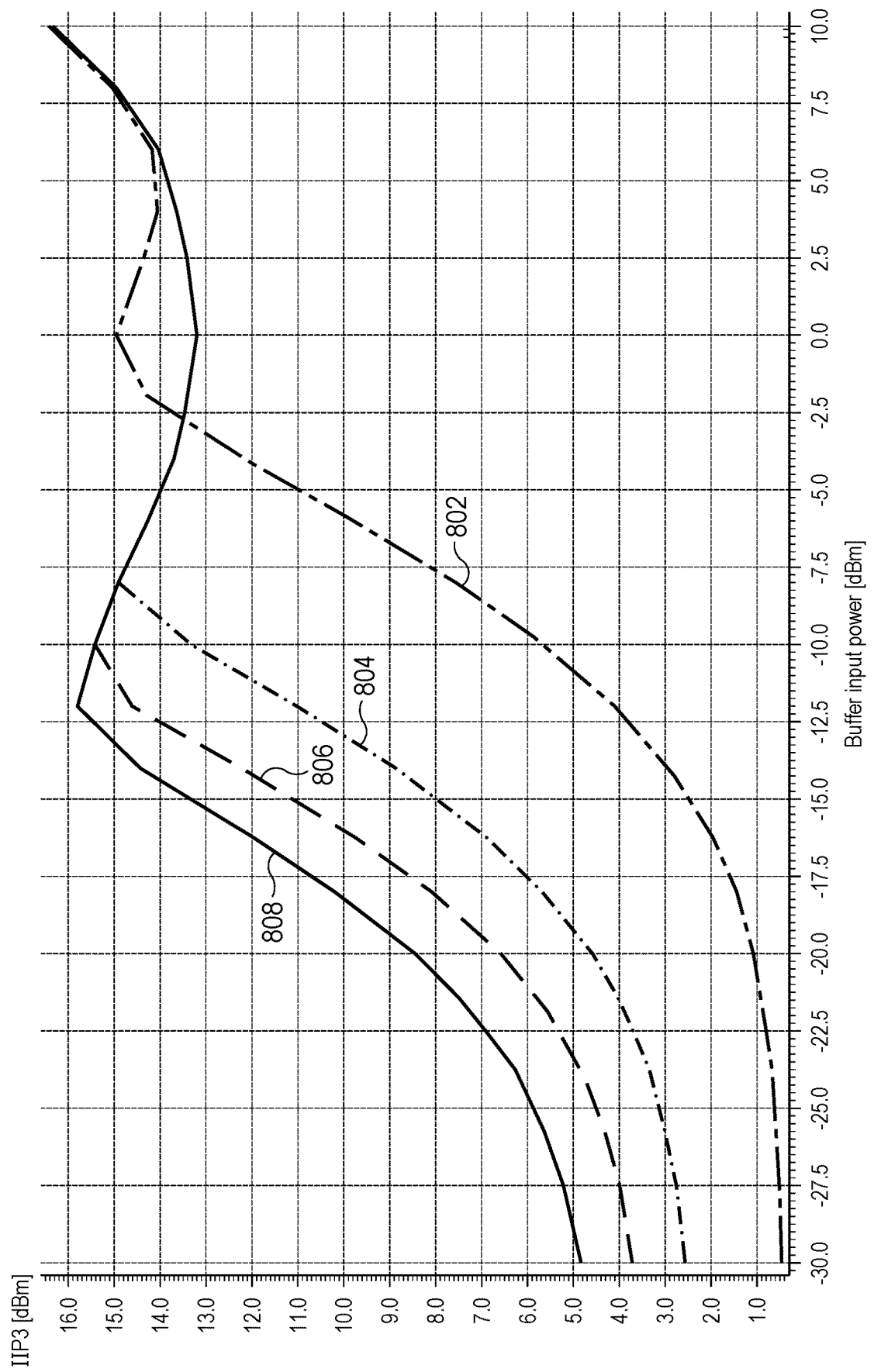
FIGS. 8 and 9 illustrate IIP3 and attenuation curves, respectively, associated with the differential driver of FIG. 7, according to an embodiment of the present invention.
Figure 9:
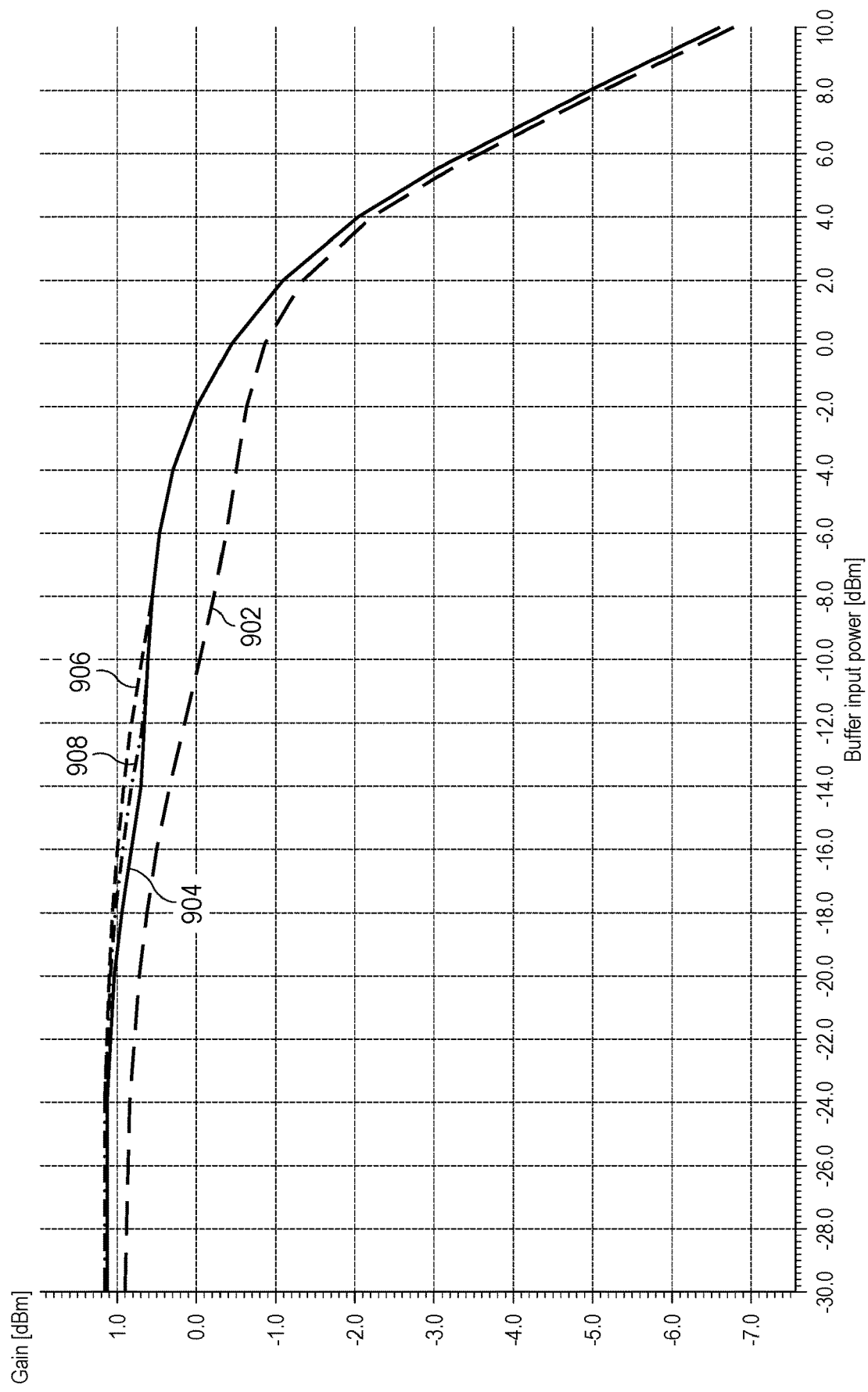

FIGS. 8 and 9 illustrate IIP3 and attenuation curves, respectively, associated with differential driver 700, according to an embodiment of the present invention. Curves 802 and 902 represent IIP3 and attenuation curves, respectively, of differential buffer 700 with a gain Kv of 0 (i.e., no modulation of voltage $V_{backgate}$, which is kept at 0 V). Curves 804 and 904 represent IIP3 and attenuation curves, respectively, of differential buffer 700 with a gain Kv of 20. Curves 806 and 906 represent IIP3 and attenuation curves, respectively, of differential buffer 700 with a gain Kv of 30. Curves 808 and 908 represent IIP3 and attenuation curves, respectively, of differential buffer 700 with a gain Kv of 40.

As illustrated in FIG. 8, there is a significant improvement in IIP3 performance when gain Kv is higher than 0 (when modulating voltage $V_{backgate}$) than when gain Kv is 0 (when keeping voltage $V_{backgate}$ grounded).

As illustrated in FIG. 9, differential buffer 700 exhibits higher gain when gain Kv is higher than 0 (when modulating voltage $V_{backgate}$) than when gain Kv is 0 (when keeping voltage $V_{backgate}$ grounded).

In some embodiments, peak detector 732 may be implemented in any way known in the art.

In some embodiments, amplifier 734 may be implemented in any way known in the art.

Figure 10:
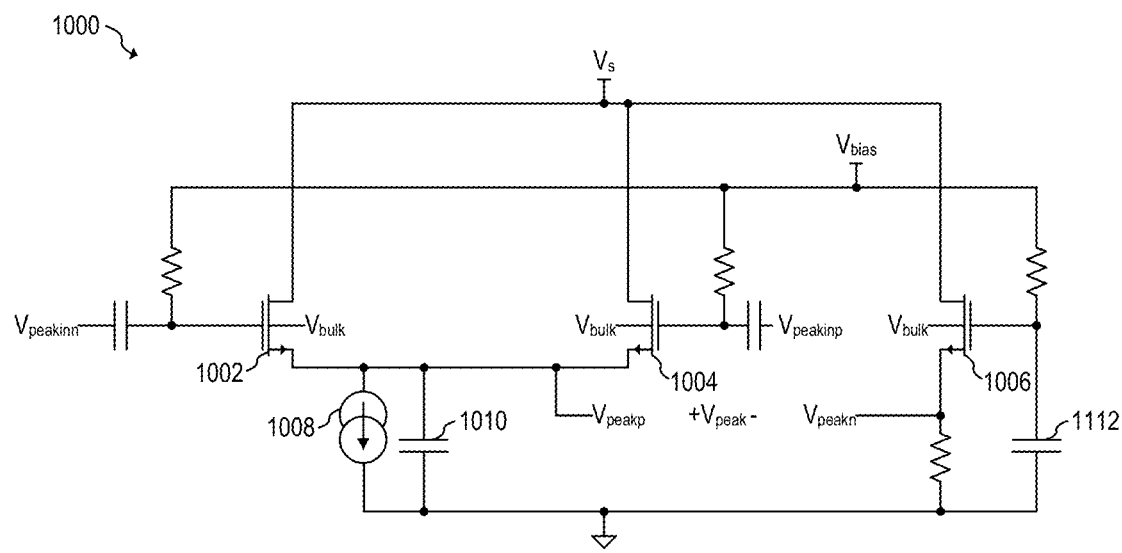
FIG. 10 shows a schematic diagram of a peak detector, according to an embodiment of the present invention.

FIG. 10 shows a schematic diagram of peak detector 1000, according to an embodiment of the present invention. Peak detector 732 may be implemented as peak detector 1000.

During normal operation, peak detector receives voltages $V_{peakinp}$ and $V_{peakinn}$ from output Vout. The differential voltage from Vout is stored in capacitor 1010, which is actively discharge with a small decay current generated by current source 1008. Capacitor 1112 stores the reference voltage when there is no RF input (since Vout is not coupled to capacitor 1112). Thus, in some embodiments, peak detector 1000 generates a differential signal $V_{peak}$ ($V_{peakp}$−$V_{peakn}$) that is proportional to the peak voltage of Vout, and which tracks such peak voltage over time.

In some embodiments, current source 1008 may generate a current between 1 µA and 2 µA. Other currents may be used.

In some embodiments, the decay current to slowly discharge capacitor 1010 may be implemented with a resistor instead of current source 1008.

As shown in FIG. 7, in some embodiments, voltage $V_{backgate}$ may be modulated using peak detector 732. In some embodiments, voltage $V_{backgate}$ may be modulated based on the gain setting of VGA 602. For example, in some embodiments, the higher the gain setting of VGA 602, the lower the voltage $V_{backgate}$, and the lower the gain setting of VGA 602, the higher the voltage $V_{backgate}$. In some embodiments, voltage $V_{backgate}$ may be dynamically changed based on the gain setting of VGA 602 from 0 V to 3 V. In some embodiments, voltage $V_{backgate}$ may be dynamically changed based on the gain setting of VGA 602 from 0 V to 1.8 V. In some embodiments, voltage $V_{backgate}$ may be dynamically changed based on the gain setting of VGA 602 from 0 V to 1.1 V. Other values may be used.

Figure 11:
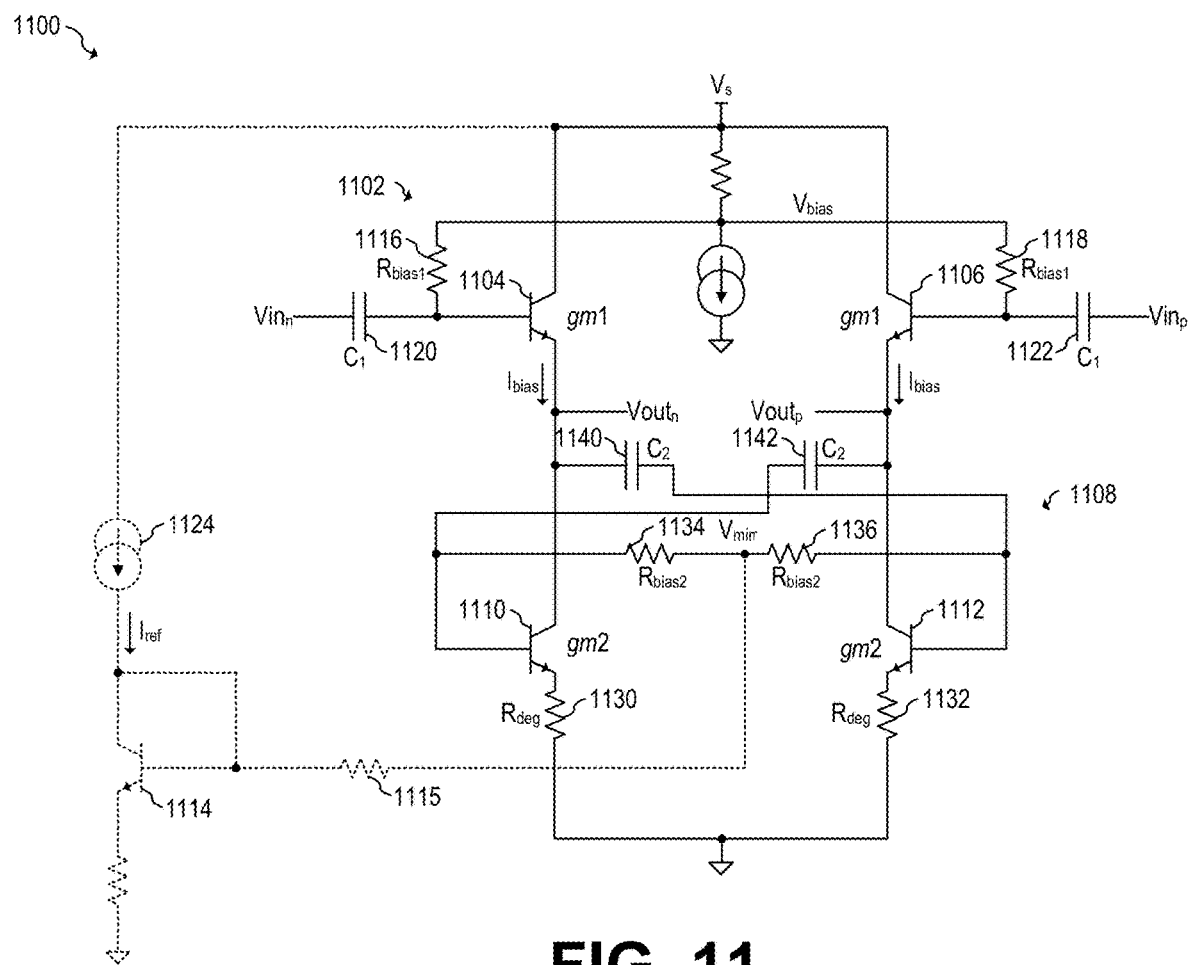
FIGS. 11 and 12 show schematic diagrams of differential buffers, according to embodiments of the present invention.

FIG. 11 shows a schematic diagram of differential buffer 1100, according to an embodiment of the present invention. Differential buffer 1100 operates in a similar manner as differential buffer 200. Differential buffer 1100, however, implements transistors 1104 1106 1110 and 1112 as bipolar transistors instead of MOS transistors.

As shown in FIG. 11, voltage $V_{mirr}$ may be provided, e.g., by a circuit including current source 1124, resistor 1115, and bipolar transistor 1114. Voltage $V_{mirr}$ may be provided in other ways.

Figure 12:
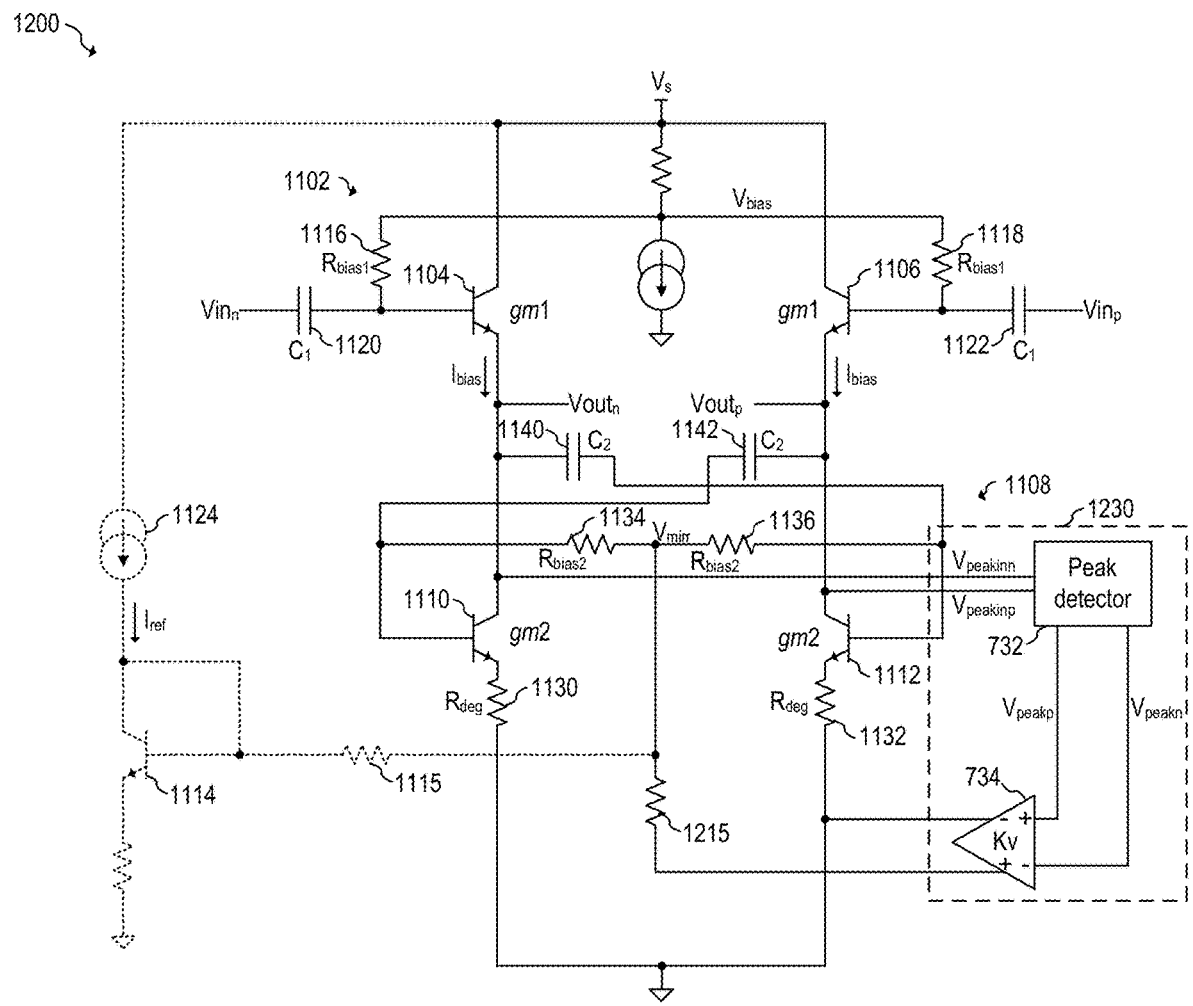

FIG. 12 shows a schematic diagram of differential buffer 1200, according to an embodiment of the present invention. Differential buffer 1200 operates in a similar manner as differential buffer 1100. Differential buffer 1200, however, dynamically modulates the bias voltage $V_{mirr}$ using modulator circuit 1230 (e.g., instead of using a fixed reference, such as provided by the circuit that includes elements 1124, 1114 and 1115).

In some embodiments, a fixed reference may be provided so as to allow $V_{mirr}$ to operate properly when there is no RF input (e.g., when Vin is 0 V). For example, in some embodiments (as shown in FIG. 12), the voltage generated by current source 1124 and transistor 1114 is provided to $V_{mirr}$ via resistor 1115, where resistors 1115 and 1215 operate as an added that sums the voltage contribution from 1124 and 1114 to the output of amplifier 734 and provides the output to $V_{mirr}$. In some embodiments, such fixed reference may be implemented as part of circuit 1230 (e.g., as an offset in peak detector 732). Other implementations are also possible.

In some embodiments, circuit 1230 operates in a similar manner as circuit 730.

Example embodiments of the present invention are summarized here. Other embodiments can also be understood from the entirety of the specification and the claims filed herein.

Example 1. A differential buffer including: first and second input terminals configured to receive a differential input voltage; first and second output terminals configured to provide a differential output voltage; a differential source follower amplifier having first and second inputs respectively coupled to the first and second input terminals, and first and second outputs respectively coupled to the first and second output terminals; and a differential common source amplifier having first and second inputs respectively coupled to the second and first output terminals via a first pair of capacitors, and first and second outputs respectively coupled to the first and second output terminals.

Example 2. The buffer of example 1, where the common source amplifier further including a pair of degeneration resistors.

Example 3. The buffer of one of examples 1 or 2, where: the source follower amplifier includes: a first transistor having a gate coupled to the first input terminal, a drain coupled to a first supply terminal, and a source coupled to the first output terminal, and a second transistor having a gate coupled to the second input terminal, a drain coupled to the first supply terminal, and a source coupled to the second output terminal; the first pair of capacitors includes first and second capacitors; and the common source amplifier includes: a third transistor having a gate coupled to the second output terminal via the second capacitor, a drain coupled to the source of the first transistor, and a source coupled to a reference terminal, and a fourth transistor having a gate coupled to the first output terminal via the first capacitor, a drain coupled to the source of the second transistor, and a source coupled to the reference terminal, the buffer further including a first bias resistor coupled between the gate of the third transistor and a first intermediate node, and a second bias resistor coupled between the gate of the fourth transistor and the first intermediate node, where the first intermediate node is configured to receive a first bias voltage.

Example 4. The buffer of one of examples 1 to 3, further including a third bias resistor coupled between the gate of the first transistor and a second intermediate node, and a fourth bias resistor coupled between the gate of the second transistor and the second intermediate node, where the second intermediate node is configured to receive a second bias voltage.

Example 5. The buffer of one of examples 1 to 4, further including: a fifth resistor coupled between the first supply terminal and the second intermediate node; and a current source coupled between the second intermediate node and the reference terminal.

Example 6. The buffer of one of examples 1 to 5, further including: a current source; and a fifth transistor in diode configuration and coupled to the current source and to the first intermediate node.

Example 7. The buffer of one of examples 1 to 6, where a body terminal of the third transistor is coupled to a second intermediate node, and where the body terminal of the fourth transistor is coupled to the second intermediate node, where the second intermediate node is configured to receive a back-gate voltage that is based on the output voltage.

Example 8. The buffer of one of examples 1 to 7, further including a peak detector having a pair of inputs respectively coupled to the first and second output terminals, and an output coupled to the second intermediate node.

Example 9. The buffer of one of examples 1 to 8, where the first, second, third, and fourth transistors and transistors of the n-type.

Example 10. The buffer of one of examples 1 to 9, where a gain of the buffer is −0.6 dBm or higher.

Example 11. The buffer of one of examples 1 to 10, where the differential input voltage and the differential output voltage are radio-frequency (RF) signals.

Example 12. The buffer of one of examples 1 to 11, where the differential buffer is implemented using a fully depleted silicon-on-insulator (FD-SOI) complementary metal-oxide-semiconductor (CMOS) process.

Example 13. The buffer of one of examples 1 to 12, where the differential buffer is implemented using a bulk complementary metal-oxide-semiconductor (CMOS) process.

Example 14. The buffer of one of examples 1 to 13, where: the source follower amplifier includes: a first bipolar transistor having a base coupled to the first input terminal, a collector coupled to a first supply terminal, and an emitter coupled to the first output terminal, and a second bipolar transistor having a base coupled to the second input terminal, a collector coupled to the first supply terminal, and an emitter coupled to the second output terminal; the first pair of capacitors includes first and second capacitors; and the common source amplifier includes: a third bipolar transistor having a base coupled to the second output terminal via the second capacitor, a collector coupled to the emitter of the first bipolar transistor, and an emitter coupled to a reference terminal, and a fourth bipolar transistor having a base coupled to the first output terminal via the first capacitor, a collector coupled to the emitter of the second bipolar transistor, and an emitter coupled to the reference terminal.

Example 15. The buffer of one of examples 1 to 14, further including: a first bias resistor coupled between the base of the third bipolar transistor and a first intermediate node; a second bias resistor coupled between the base of the fourth bipolar transistor and the first intermediate node; and a peak detector having a pair of inputs respectively coupled to the first and second output terminals, and an output coupled to the first intermediate node.

Example 16. A method including: receiving a differential input voltage with inputs of a differential source follower amplifier; receiving, at inputs of a differential common source amplifier, a differential output voltage from outputs of the source follower amplifier, where the outputs of the source follower amplifier are capacitively coupled to the inputs of the common source amplifier, and where outputs of the common source amplifier are coupled to the outputs of the source follower amplifier; and providing the output voltage to an input of a next circuit.

Example 17. The method of example 16, where the common source amplifier is degenerated.

Example 18. The method of one of examples 16 or 17, where the common source amplifier includes a first pair of transistors, the method further including modulating body terminals of the first pair of transistors based on the output voltage.

Example 19. The method of one of examples 16 to 18, where the source follower amplifier includes a second pair of transistors having drains receiving a first supply voltage, where the first supply voltage is between 1 V and 2 V, and where modulating the body terminals of the first pair of transistors includes modulating the body terminals of the first pair of transistors between 0 V and 3 V.

Example 20. The method of one of examples 16 to 19, further including providing the input voltage to the source follower amplifier using a variable gain amplifier, where modulating the body terminals of the first pair of transistors includes modulating the body terminals of the first pair of transistors based on a gain setting of the variable gain amplifier.

Example 21. The method of one of examples 16 to 20, further including: providing the input voltage to the source follower amplifier using a variable gain amplifier; and providing a bias voltage to the common source amplifier based on a gain setting of the variable gain amplifier.

Example 22. The method of one of examples 16 to 21, where a frequency of the input voltage is higher than 1 GHz.

Example 23. A device including: a first circuit configured to receive a radio-frequency signal and provide a differential input voltage; and a differential buffer including first and second input terminals configured to receive the differential input voltage, first and second output terminals configured to provide a differential output voltage, a differential source follower amplifier having first and second inputs respectively coupled to the first and second input terminals, and first and second outputs respectively coupled to the first and second output terminals, and a differential common source amplifier having first and second inputs respectively coupled to the second and first output terminals via a first pair of capacitors, and first and second outputs respectively coupled to the first and second output terminals.

Example 24. The device of example 23, where the first circuit includes a variable gain amplifier having a gain setting, where the differential buffer is configured based on the gain setting of the variable gain amplifier.

Example 25. The device of one of examples 23 or 24, where the device includes a satellite radio receiver.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A differential buffer comprising:
   first and second input terminals configured to receive a differential input voltage;
   first and second output terminals configured to provide a differential output voltage;
   a differential source follower amplifier having first and second inputs respectively coupled to the first and second input terminals, and first and second outputs respectively coupled to the first and second output terminals, the differential source follower amplifier comprising:
      a first transistor having a gate coupled to the first input terminal, a drain coupled to a first supply terminal, and a source coupled to the first output terminal, and
      a second transistor having a gate coupled to the second input terminal, a drain coupled to the first supply terminal, and a source coupled to the second output terminal;
   a differential common source amplifier having first and second inputs respectively coupled to the second and first output terminals via a first pair of capacitors, the first pair of capacitors comprising first and second capacitors, and first and second outputs respectively coupled to the first and second output terminals, the differential common source amplifier comprising:
      a third transistor having a gate coupled to the second output terminal via the second capacitor, a drain coupled to the source of the first transistor, and a source coupled to a reference terminal, and
      a fourth transistor having a gate coupled to the first output terminal via the first capacitor, a drain coupled to the source of the second transistor, and a source coupled to the reference terminal, the buffer further comprising a first bias resistor coupled between the gate of the third transistor and a first intermediate node, and a second bias resistor coupled between the gate of the fourth transistor and the first intermediate node, wherein the first intermediate node is configured to receive a first bias voltage;
   a third bias resistor coupled between the gate of the first transistor and a second intermediate node; and
   a fourth bias resistor coupled between the gate of the second transistor and the second intermediate node, wherein the second intermediate node is configured to receive a second bias voltage.

2. The buffer of claim 1, wherein the common source amplifier further comprising a pair of degeneration resistors.

3. The buffer of claim 1, further comprising:
   a fifth resistor coupled between the first supply terminal and the second intermediate node; and
   a current source coupled between the second intermediate node and the reference terminal.

4. The buffer of claim 1, further comprising:
   a current source; and
   a fifth transistor in diode configuration and coupled to the current source and to the first intermediate node.

5. The buffer of claim 1, wherein a body terminal of the third transistor is coupled to a second intermediate node, and wherein the body terminal of the fourth transistor is coupled to the second intermediate node, wherein the second intermediate node is configured to receive a back-gate voltage that is based on the output voltage.

6. The buffer of claim 5, further comprising a peak detector having a pair of inputs respectively coupled to the first and second output terminals, and an output coupled to the second intermediate node.

7. The buffer of claim 1, wherein the first, second, third, and fourth transistors are transistors of the n-type.

8. The buffer of claim 1, wherein a gain of the buffer is −0.6 dBm or higher.

9. The buffer of claim 1, wherein the differential input voltage and the differential output voltage are radio-frequency (RF) signals.

10. The buffer of claim 1, wherein the differential buffer is implemented using a fully depleted silicon-on-insulator (FD-SOI) complementary metal-oxide-semiconductor (CMOS) process.

11. The buffer of claim 1, wherein the differential buffer is implemented using a bulk complementary metal-oxide-semiconductor (CMOS) process.

12. A method comprising:
receiving a differential input voltage with inputs of a differential source follower amplifier;
receiving, at inputs of a differential common source amplifier, a differential output voltage from outputs of the source follower amplifier, wherein the common source amplifier is degenerated, wherein the common source amplifier comprises a first pair of transistors, wherein the outputs of the source follower amplifier are capacitively coupled to the inputs of the common source amplifier, and wherein outputs of the common source amplifier are coupled to the outputs of the source follower amplifier;
modulating body terminals of the first pair of transistors based on the output voltage; and
providing the output voltage to an input of a next circuit.

13. The method of claim 12, wherein the source follower amplifier comprises a second pair of transistors having drains receiving a first supply voltage, wherein the first supply voltage is between 1 V and 2 V, and wherein modulating the body terminals of the first pair of transistors comprises modulating the body terminals of the first pair of transistors between 0 V and 3 V.

14. The method of claim 12, further comprising providing the input voltage to the source follower amplifier using a variable gain amplifier, wherein modulating the body terminals of the first pair of transistors comprises modulating the body terminals of the first pair of transistors based on a gain setting of the variable gain amplifier.

15. The method of claim 12, further comprising:
providing the input voltage to the source follower amplifier using a variable gain amplifier; and
providing a bias voltage to the common source amplifier based on a gain setting of the variable gain amplifier.

16. The method of claim 12, wherein a frequency of the input voltage is higher than 1 GHz.

17. A device comprising:
a first circuit configured to receive a radio-frequency signal and provide a differential input voltage, wherein the first circuit comprises a variable gain amplifier having a gain setting; and
a differential buffer configured based on the gain setting of the variable gain amplifier, the differential buffer comprising
first and second input terminals configured to receive the differential input voltage,
first and second output terminals configured to provide a differential output voltage,
a differential source follower amplifier having first and second inputs respectively coupled to the first and second input terminals, and first and second outputs respectively coupled to the first and second output terminals, and
a differential common source amplifier having first and second inputs respectively coupled to the second and first output terminals via a first pair of capacitors, and first and second outputs respectively coupled to the first and second output terminals.

18. The device of claim 17, wherein the device comprises a satellite radio receiver.

19. The device of claim 18, wherein the differential source follower amplifier comprises:
a first bipolar transistor having a base coupled to the first input terminal, a collector coupled to a first supply terminal, and an emitter coupled to the first output terminal; and
a second bipolar transistor having a base coupled to the second input terminal, a collector coupled to the first supply terminal, and an emitter coupled to the second output terminal.

20. The device of claim 19, wherein the first pair of capacitors comprises first and second capacitors.

21. The device of claim 20, wherein the differential common source amplifier comprises:
a third bipolar transistor having a base coupled to the second output terminal via the second capacitor, a collector coupled to the emitter of the first bipolar transistor, and an emitter coupled to a reference terminal, and
a fourth bipolar transistor having a base coupled to the first output terminal via the first capacitor, a collector coupled to the emitter of the second bipolar transistor, and an emitter coupled to the reference terminal.

22. The device of claim 21, further comprising:
a first bias resistor coupled between the base of the third bipolar transistor and a first intermediate node;
a second bias resistor coupled between the base of the fourth bipolar transistor and the first intermediate node; and
a peak detector having a pair of inputs respectively coupled to the first and second output terminals, and an output coupled to the first intermediate node.

23. The buffer of claim 1, wherein the buffer is implemented with p-type transistors.

24. The buffer of claim 1, wherein the buffer is implemented with bipolar transistors.

25. The device of claim 17, wherein the differential buffer is implemented with MOS transistors.

* * * * *